United States Patent
Lee et al.

(10) Patent No.: US 9,001,560 B2
(45) Date of Patent: Apr. 7, 2015

(54) NONVOLATILE MEMORY DEVICES USING VARIABLE RESISTIVE ELEMENTS AND RELATED DRIVING METHODS THEREOF

(71) Applicants: Sung-Yeon Lee, Seoul (KR); Yeong-Taek Lee, Seoul (KR); Bo-Geun Kim, Suwon-si (KR)

(72) Inventors: Sung-Yeon Lee, Seoul (KR); Yeong-Taek Lee, Seoul (KR); Bo-Geun Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/100,183

(22) Filed: Dec. 9, 2013

(65) Prior Publication Data

US 2014/0160831 A1    Jun. 12, 2014

(30) Foreign Application Priority Data

Dec. 11, 2012 (KR) ........................ 10-2012-0143772

(51) Int. Cl.
    *G11C 13/00*      (2006.01)
    *G11C 16/10*      (2006.01)
    *G11C 7/00*      (2006.01)
    *G11C 11/56*      (2006.01)
    *G11C 7/10*      (2006.01)

(52) U.S. Cl.
    CPC ........ *G11C 13/0002* (2013.01); *G11C 13/0064* (2013.01); *G11C 13/0069* (2013.01); *G11C 7/00* (2013.01); *G11C 7/1096* (2013.01); *G11C 11/56* (2013.01); *G11C 11/5678* (2013.01); *G11C 13/0004* (2013.01); *G11C 2013/0092* (2013.01); *G11C 2213/71* (2013.01); *G11C 2213/72* (2013.01)

(58) Field of Classification Search
    CPC ........... G11C 13/0069; G11C 13/0002; G11C 13/0064; G11C 7/00; G11C 7/1096
    USPC ............................................. 365/148, 189.16
See application file for complete search history.

(56) References Cited

U.S. PATENT DOCUMENTS

| | | |
|---|---|---|
| 5,812,457 A | 9/1998 | Arase |
| 7,929,350 B2 | 4/2011 | Hwang |
| 2007/0091665 A1 | 4/2007 | Oh et al. |
| 2008/0239805 A1 | 10/2008 | Shiga et al. |
| 2010/0124122 A1 | 5/2010 | Jeong et al. |
| 2010/0195387 A1 | 8/2010 | Park |

*Primary Examiner* — Ly D Pham
(74) *Attorney, Agent, or Firm* — Myers Bigel Sibley & Sajovec

(57) ABSTRACT

Driving methods of a nonvolatile memory device are provided. The driving method includes providing a start pulse adjusted based on a previous write operation to a resistive memory cell to write data, verifying whether the data has accurately been written using the start pulse, and executing a write operation on the resistive memory cell by an incremental one-way write method or a decremental one-way write method according to the verify result. Related nonvolatile memory devices are also provided.

17 Claims, 21 Drawing Sheets

FIG. 1

| | 1_1 | 1_2 | 1_3 | 1_4 | 1_5 | 1_6 | 1_7 | 1_8 |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |

| SA/WD(2_1) | SA/WD(2_2) | SA/WD(2_3) | SA/WD(2_4) |
|---|---|---|---|

| PERIPHERY(3) |
|---|

| SA/WD(2_8) | SA/WD(2_7) | SA/WD(2_6) | SA/WD(2_5) |
|---|---|---|---|

| | BLK7 | BLK7 | BLK7 | BLK7 | BLK7 | BLK7 | BLK7 | BLK7 |
|---|---|---|---|---|---|---|---|---|
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | 1_16 | 1_15 | 1_14 | 1_13 | 1_12 | 1_11 | 1_10 | 1_9 |

FIG. 6
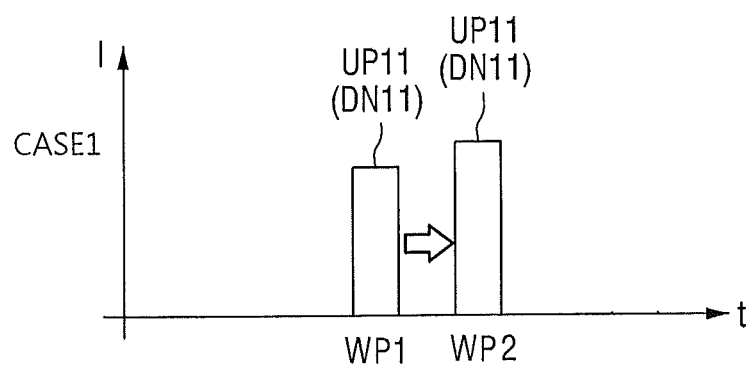
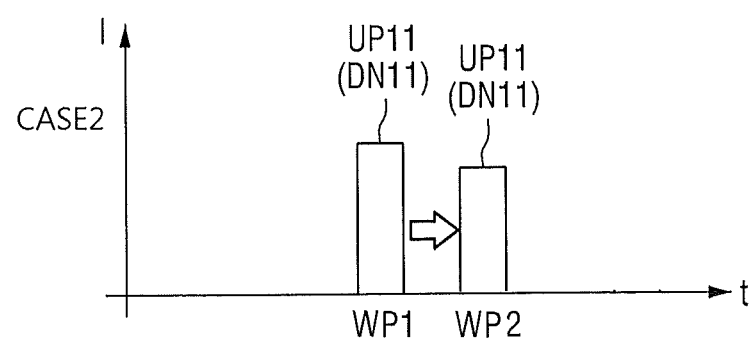

FIG. 8
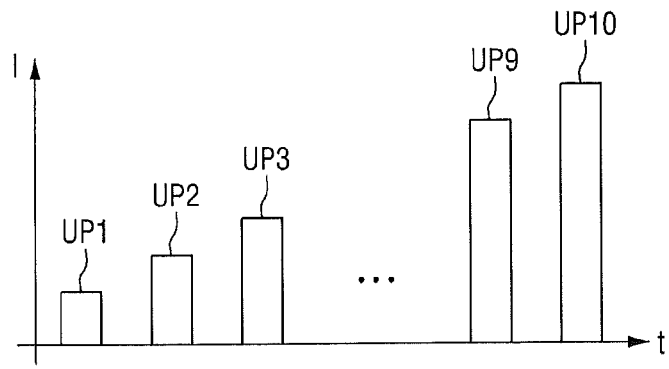
COMPARED ART 1
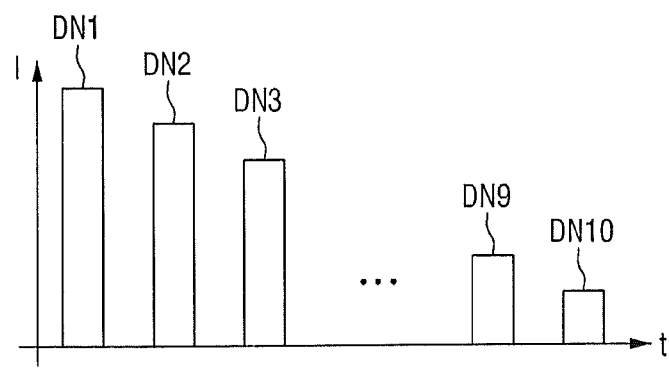
COMPARED ART 2
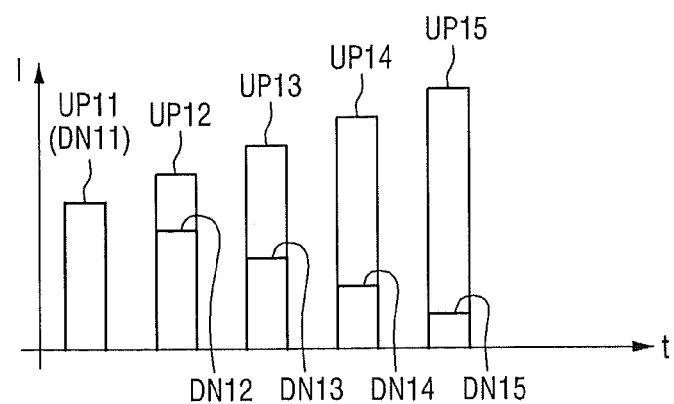
PRESENT INVENTION

NONVOLATILE MEMORY DEVICES USING VARIABLE RESISTIVE ELEMENTS AND RELATED DRIVING METHODS THEREOF

CROSS-REFERENCE TO RELATED APPLICATION

This application claims priority from Korean Patent Application No. 10-2012-0143772, filed on Dec. 11, 2012 in the Korean Intellectual Property Office, the contents of which is incorporated herein by reference as if set forth in its entirety.

FIELD

The present inventive concept relates generally to semiconductor devices and, more particularly, to nonvolatile memory devices using variable resistive elements and related driving methods thereof.

BACKGROUND

Nonvolatile memories using resistance materials include phase-change random access memories (PRAMs), resistive RAMs (RRAMs), and magnetic RAMs (MRAMs). While dynamic RAMs (DRAMs) or flash memories store data using charges, nonvolatile memories using resistance materials store data using a state change of a phase-change material, such as chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

In particular, a phase-change material of a PRAM becomes a crystalline state or an amorphous state as it is cooled after being heated. The phase-change material has low resistance in the crystalline state and has high resistance in the amorphous state. Therefore, the crystalline state may be defined as set data or data 0, and the amorphous state may be defined as reset data or data 1.

SUMMARY

The present inventive concept provides a nonvolatile memory device, which can reduce the number of write/verify operation loops.

The present inventive concept also provides a driving method of a nonvolatile memory device, which can reduce the number of write/verify operation loops.

Some embodiments of the present inventive concept provide a driving method of a nonvolatile memory device. The driving method includes providing a start pulse adjusted based on a previous write operation to a resistive memory cell to write data; verifying whether the data has accurately been written using the start pulse; and executing a write operation on the resistive memory cell by an incremental one-way write method or a decremental one-way write method according to the verify result.

Further embodiments of the present inventive concept provide a driving method of a nonvolatile memory device. The driving method includes writing data on a plurality of first resistive memory cells by an incremental one-way write method for the duration of the number of first loops and writing data on a plurality of second resistive memory cells by a decremental one-way write method for the duration of the number of second loops; and adjusting a start pulse of a next write operation using the number of first loops and the number of second loops.

Still further embodiments of the present inventive concept provide a driving method of a nonvolatile memory device. The driving method includes providing a start pulse to a resistive memory cell in a first loop of a write operation to write data and executing a verify operation using a first verify reference value and a second verify reference value different from each other and providing a write pulse varying for each of loops ranging from a second loop to the last loop of the write operation to the resistive memory cell to write data and executing a verify operation using the first verify reference value while not using the second verify reference value.

Some embodiments of the present inventive concept provide a nonvolatile memory device including a resistive memory cell, a sense amplifier corresponding to the resistive memory cell, and a write driver corresponding to the resistive memory cell. The write driver provides a start pulse determined based on a previous write operation to the resistive memory cell, the sense amplifier performs a verify operation using the start pulse, and the write driver executes a write operation on the resistive memory cell by an incremental one-way write method or a decremental one-way write method according to the verify result.

BRIEF DESCRIPTION OF THE DRAWINGS

The above and other features and advantages of the present inventive concept will become more apparent by describing in detail embodiments thereof with reference to the attached drawings in which:

FIG. 1 is a layout view illustrating a nonvolatile memory device according to some embodiments of the present inventive concept.

FIGS. 5 to 7 illustrate a driving method of the nonvolatile memory device according to some embodiments of the present inventive concept.

FIG. 8 illustrates effects of the operating method of the nonvolatile memory device according to some embodiments of the present inventive concept.

DETAILED DESCRIPTION OF THE EMBODIMENTS

Figure 2:
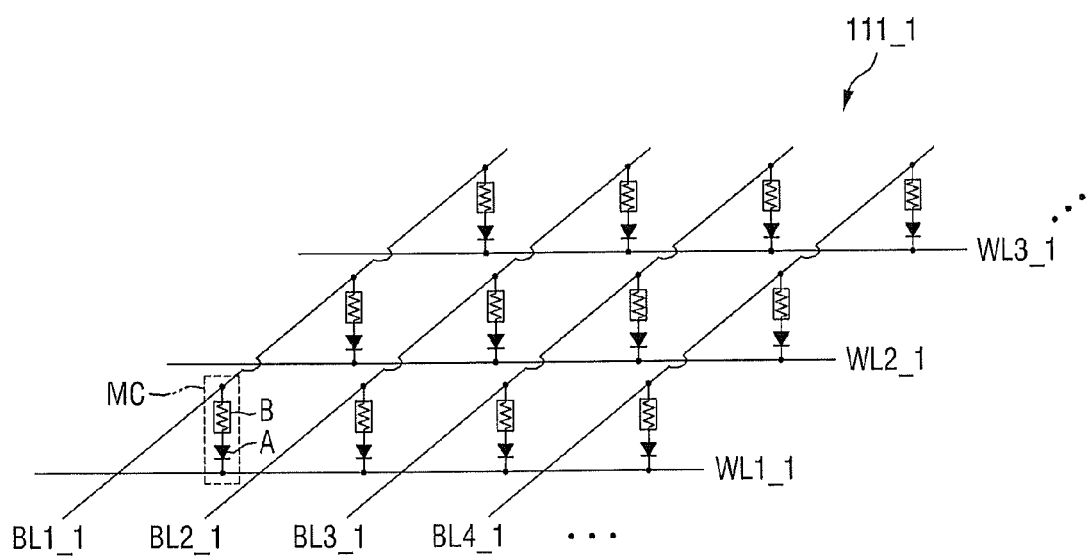
FIGS. 2 and 3 illustrate structures of the memory cell array illustrated in FIG. 1.

The present inventive concept will now be described more fully hereinafter with reference to the accompanying drawings, in which embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

The present inventive concept will be described with reference to perspective views, cross-sectional views, and/or plan views, in which preferred embodiments of the inventive concept are shown. Thus, the profile of an exemplary view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Referring to FIG. 1, a layout view illustrating a nonvolatile memory device according to some embodiments of the present inventive concept will be discussed. For the sake of convenient explanation, FIG. 1 illustrates a nonvolatile memory device including 16 memory banks by way of example, but aspects of the present inventive concept are not limited to this configuration.

As illustrated in FIG. 1, the nonvolatile memory device according to some embodiments of the present inventive concept includes a memory cell array, a plurality of sense amplifiers/write drivers (SA/WD) 2_1 to 2_8, and a peripheral circuit region (PERIPHERY) 3.

The memory cell array may include a plurality of memory banks 1_1 to 1_16, each of the memory banks 1_1 to 1_16 may include a plurality of memory blocks BLK0 to BLK7, each of the memory blocks BLK0 to BLK7 may include a plurality of nonvolatile memory cells arranged in a matrix configuration. In some embodiments of the present inventive concept, each 8 memory blocks are exemplified, but aspects of the present inventive concept are not limited to this configuration.

Furthermore, row select circuits and column select circuits defining rows and columns of nonvolatile memory cells to be written/read are arranged to correspond to the memory banks 1_1 to 1_16.

The sense amplifiers/write drivers 2_1 to 2_8 may include the above-described write & verify driver (130 of FIG. 2). Furthermore, each of the sense amplifiers/write drivers 2_1 to 2_8 is arranged to correspond to two memory banks 1_1 to 1_16 and perform read and write operations in the corresponding memory banks. In some embodiments of the present inventive concept, each of the sense amplifiers/write drivers 2_1 to 2_8 corresponds to two memory banks 1_1 to 1_16, but aspects of the present inventive concept are not limited to this configuration. In other words, each of the sense amplifiers/write drivers may also be arranged to correspond one or four memory banks.

A plurality of logic circuit blocks and a voltage generator for operating various circuit blocks, for example, sense amplifiers/write drivers 2_1 to 2_8, etc., may be arranged in the peripheral circuit region 3.

Figure 3:
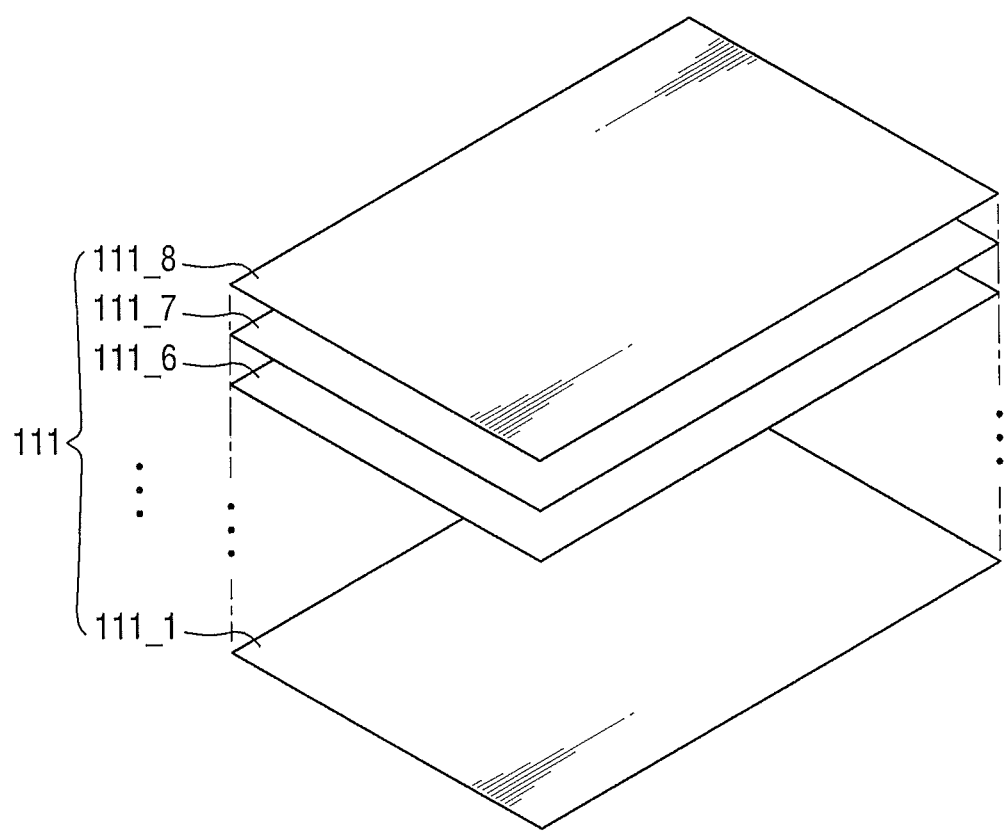

FIGS. 2 and 3 illustrate structures of the memory cell array illustrated in FIG. 1. Referring first to FIG. 2, the memory cell array may have a cross point structure. The cross point structure may be a structure in which a memory cell is formed at an intersection of one line and another. For example, bit lines BL1_1 to BL4_1 are formed to extend in a first direction, word lines WL1_1 to WL3_1 are formed to extend in a second direction so as to cross the bit lines BL1_1 to BL4_1, and resistive memory cells MC may be formed at intersections of bit lines BL1_1 to BL4_1 and the word lines WL1_1 to WL3_1.

The resistive memory cells are resistive memory cells selected among the plurality of resistive memory cells in the memory cell array, for example, resistive memory cells selected for read or program operations. In these embodiments, in a case where the resistive memory cells MC are PRAMs, each of the resistive memory cells MC may include a variable resistive element B including a phase change material, and an access element A controlling the current flowing through the variable resistive element B. In these embodiments, the access element A may be a diode or a transistor connected to the variable resistive element B in series. In addition, the phase change material may have a different resistance value according to a crystalline state or an amorphous state. For example, the phase-change material may be a combination of two elements, such as GaSb, InSb, InSe, $Sb_2Te_3$ or GeTe, a combination of three elements, such as GeSbTe, GaSeTe, InSbTe, $SnSb_2Te_4$ or InSbGe, or a combination of four elements such as AgInSbTe, (GeSn)SbTe, GeSb(SeTe) or $Te_{81}Ge_{15}Sb_2S_2$. Specifically, GeSbTe including germanium (Ge), antimony (Sb) and tellurium (Te) may be usually used.

Meanwhile, in a case where the resistive memory cells MC are RRAMs, the variable resistive element B may include, for example, NiO or perovskite. The perovskite may be a composition of manganite (such as $Pr_{0.7}Ca_{0.3}MnO_3$, $Pr_{0.5}Ca_{0.5}MnO_3$, PCMO, and LCMO), titanate (such as STO:Cr), and/or zirconate (such as SZO:Cr, $Ca_2Nb_2O_7$:Cr, and $Ta_2O_5$:Cr).

Alternatively, as illustrated in FIG. 3, the memory cell array may have a three-dimensional (3D) stacked structure. The 3D stacked structure may be a structure in which a plurality of memory cell layers 111_1 to 111_8 are vertically stacked. 8 memory cell layers 111_1 to 111_8 are stacked vertically are exemplified in FIG. 3, but aspects of the present inventive concept are not limited thereto. In these embodiments, each of the memory cell layers 111_1 to 111_8 may include a plurality of memory cell groups and/or a plurality of redundancy memory cell groups. In embodiments where the memory cell array has a 3D stacked structure, each of the memory cell layers 111_1 to 111_8 may have a cross point structure shown in FIG. 2, but aspects of the present inventive concept are not limited thereto.

Figure 4:
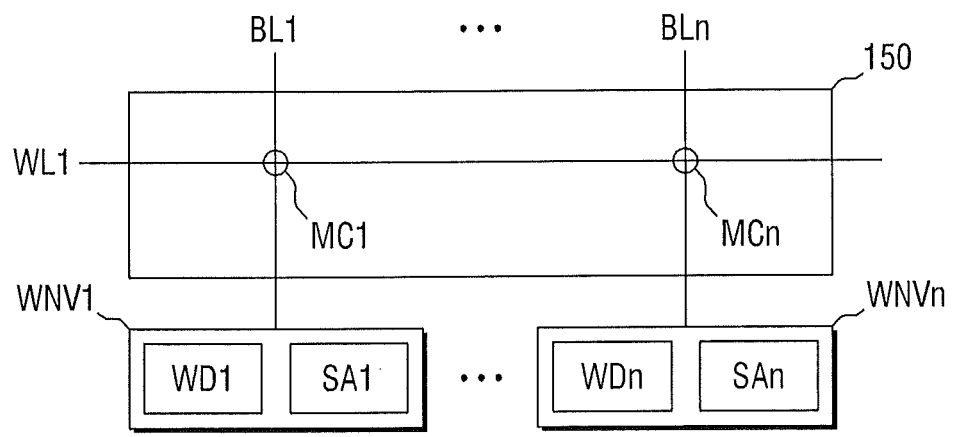
FIG. 4 is a block diagram illustrating a nonvolatile memory device according to some embodiments of the present inventive concept.
Figure 5:
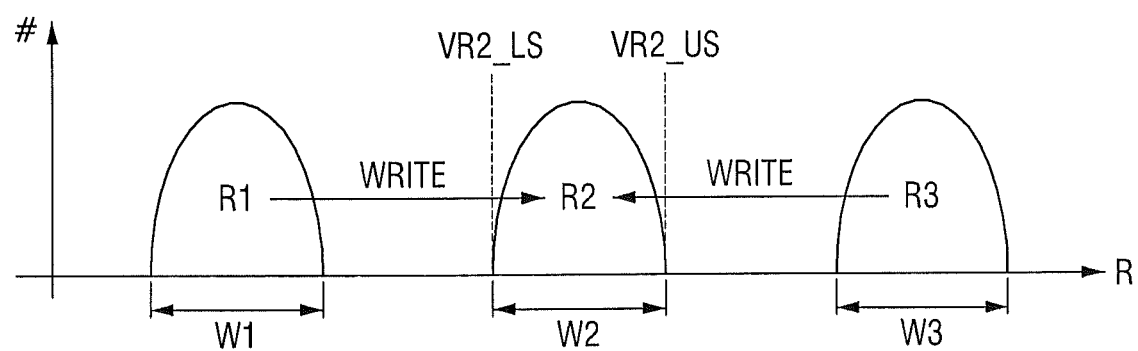
Figure 7:
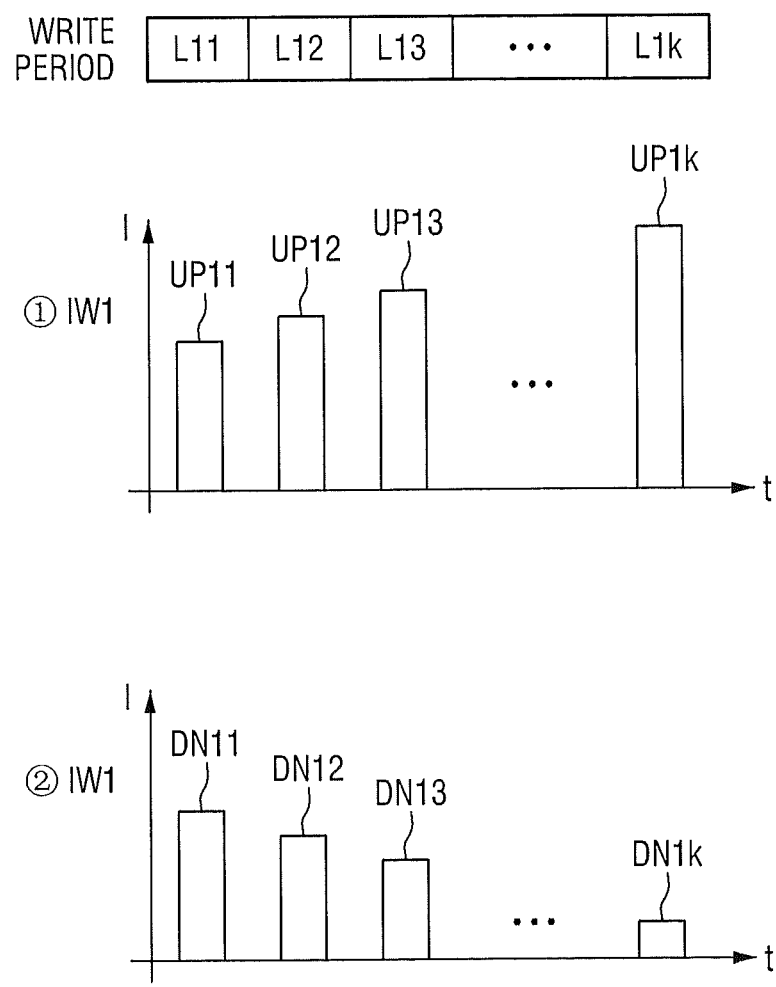

FIG. 4 is a block diagram illustrating a nonvolatile memory device according to some embodiments of the present inventive concept, FIGS. 5 to 7 illustrate a driving method of the nonvolatile memory device according to some embodiments of the present inventive concept, and FIG. 8 illustrates effects of the operating method of the nonvolatile memory device according to some embodiments of the present inventive concept.

Referring first to FIG. 4, the nonvolatile memory device according to some embodiments of the present inventive concept may include a memory cell array 110 and a plurality of write/verify units WNV1 to WNVn, where n is a natural number.

The memory cell array 110 includes a plurality of resistive memory cells MC1 to MCn. In some embodiments, a resistive memory cell MC1 positioned in the memory cell array 110 and connected to a word line WL1 and a bit line BL1, and a resistive memory cell MCn connected to the word line WL1 and a bit line BLn are exemplified.

Each of the plurality of write/verify units WNV1 to WNVn may include write drivers WD1 to WDn and sense amplifiers SA1 to SAn.

The operations of the write/verify units WNV1 to WNVn will now be discussed with respect to 5 to 7.

As illustrated in FIG. 5, a write driver (e.g., WD1) may write second data R2 in the resistive memory cell (e.g., MC1). As illustrated in FIG. 5, first to third data R1 to R3 may correspond to first to third resistance W1 to W3. For example, the second data R2 may be written to the resistive memory cell MC1 in which the first data R1 is stored. Alternatively, the second data R2 may also be written to the resistive memory cell MC1 in which the third data R3 is stored.

In the first loop of a write period, the write driver WD1 provides a start pulse UP11 or DN11 to the resistive memory cell MC1. The sense amplifier (e.g., SA1) performs a verify operation using the start pulse UP11 or DN11. The sense amplifier (e.g., SA1) may execute a verify operation using two verify reference values VR2_LS and VR2_US.

In some embodiments, if a resistance value of the resistive memory cell MC1 is smaller than the verify reference value VR2_LS, the write operation is executed from the second loop to the last loop of the write period by the incremental write method (see ① of FIG. 7). In other words, the sense amplifier SA1 uses two verify reference values VR2_LS and VR2_US in the first loop of the write period and uses only one verify reference value VR2_LS in the loops from the second loop to the last loop of the write period. In some embodiments, the other verify reference value VR2_US is not used.

If a resistance level of the resistive memory cell MC1 is greater than the verify reference value VR2_US, the write operation is executed from the second loop to the last loop of the write period by the decremental write method (see ② of FIG. 7). In other words, the sense amplifier SA1 uses two verify reference values VR2_LS and VR2_US in the first loop of the write period and uses only one verify reference value VR2_US in the loops from the second loop to the last loop of the write period. In these embodiments, the other verify reference value VR2_LS is not used.

Consequently, the write operation may be executed on some resistive memory cells (e.g., MC1) among the plurality of resistive memory cells MC1 to MC by the incremental write method, while the write operation may be executed on some other resistive memory cells (e.g., MCn).

Referring now to FIG. 6, start pulses UP11 or DN11 of the previous write operation (e.g., WP1) and the current write operation (e.g., WP2) may have different magnitudes.

As in CASE1, the start pulse UP11 or DN11 of the current write operation WP2 may be greater than that of the previous write operation WP1. As in CASE2, the start pulse UP11 or DN11 of the current write operation WP2 may be smaller than that of the previous write operation WP1.

The start pulse UP11 or DN11 is adjusted based on the previous write operation WP1.

For example, the start pulse UP11 or DN11 may be adjusted using the number of first loops executed in the previous write operation WP1 by the incremental one-way write method and the number of second loops executed in the previous write operation WP1 by the decremental one-way write method.

In the previous write operation WP1, if the number of first loops is greater than the number of second loops, as in CASE1, the start pulse UP11 or DN11 of the current write operation WP2 is increased.

In the previous write operation WP1, if the number of first loops is smaller than the number of second loops, as in CASE2, the start pulse UP11 or DN11 of the current write operation WP2 is decreased.

Alternatively, the start pulse UP11 or DN11 may be adjusted such that the number of first loops of the current write operation WP2 becomes equal to the number of second loops of the current write operation WP2. For example, if the number of first loops is 4 and the number of second loops is 6, the start pulse UP11 or DN11 may be adjusted to make both of the number of first loops and the number of second loops become 5. In a case where the incremental one-way write method and the decremental one-way write method are simultaneously performed, if the number of first loops and the number of second loops are equal to each other, the write operation can be terminated with a minimum number of loops.

Therefore, the start pulse UP11 or DN11 may be a median value among multiple pulses used in the previous write operation WP1.

Referring now to FIG. 7, the sense amplifier (e.g., SA1) may perform a verify operation using two verify reference values VR2_LS and VR2_US. That is to say, the write method may be determined according to the verify result of the sense amplifier SA1.

If a resistance level of the resistive memory cell MC1 is smaller than the verify reference value VR2_LS, as in ① of FIG. 7, a write current IW1 supplied for each of the loops L11 to L1k may be continuously increased. As shown, the write current IW1 may have a pulse UP11 in the first loop L11, a pulse UP12 in the second loop L12, or a pulse UP1k in the kth loop L1k, as the write IW1 may be increased with a constant increment, as shown. However, the increment of the write IW1 may not be constant.

If a resistance level of the resistive memory cell $MC_1$ is greater than the verify reference value VR2_US, as in ② of FIG. 7, the write current IW1 supplied for each of the loops L11 to L1k may be continuously decreased. As illustrated, the write current IW1 may have a pulse DN11 in the first loop L11, a pulse DN12 in the second loop L12, or a pulse DN1k in the kth loop L1k, as the write IW1 may be decreased with a constant decrement, as shown. However, the decrement of the write IW1 may not be constant.

As illustrated in FIG. 7, the start current UP11 in W and the start current DN11 in have the same magnitude because the start current UP11 or DN11 is supplied in the first loop of the write operation and the write method to be used in the other loops are determined according to the verify result.

Referring now to FIG. 8, in compared art 1, since the start pulse UP1 is considerably small in magnitude, a write current may include pulses UP1 to UP10 increasing in 10 steps during a write period (that is, the number of loops=10). In compared art 2, since the start pulse DN1 is considerably large in magnitude, a write current may include pulses DN1 to DN10 decreasing in 10 steps during a write period (that is, the number of loops=10).

In contrast, in some embodiments of the present inventive concept, the start pulse UP11 or DN11 may be a median value among multiple pulses used in the previous write operation WP1. As the result, even if the write operation is executed by the incremental write method, a write current may include pulses UP11 to UP15 increasing in 5 steps during a write period (that is, the number of loops=5). Even if the write operation is executed by the decremental write method, a write current may include pulses DN11 to DN15 decreasing in 5 steps during a write period (that is, the number of loops=5). Therefore, the nonvolatile memory device according to some embodiments of the present inventive concept may have the reduced number of loops to half, compared to the nonvolatile memory device of compared art 1 or 2.

Figure 9:
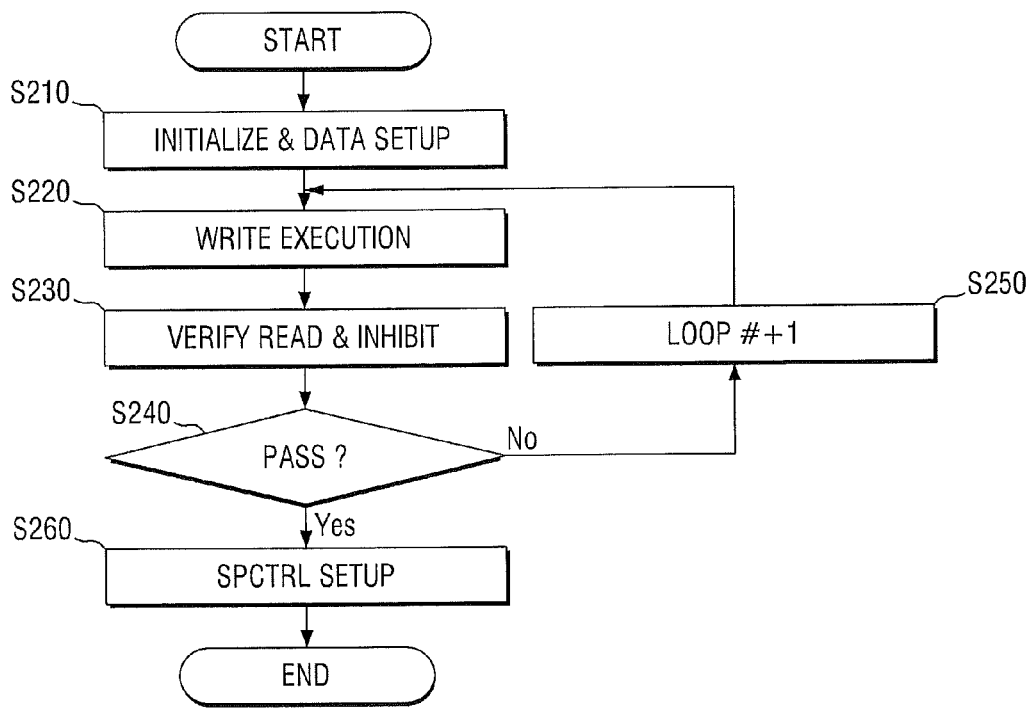
FIG. 9 is a representative flowchart illustrating a driving method of a nonvolatile memory device according to some embodiments of the present inventive concept.

FIG. 9 is a representative flowchart illustrating a driving method of a nonvolatile memory device according to some embodiments of the present inventive concept.

Referring now to FIG. 9, first, the nonvolatile memory device is initialized and data is set up (S210). For example, logic blocks required to perform a write operation (e.g., multiple counters 130_1 and 130_2 illustrated in FIG. 10, enable latches EL1 and EL2 shown in FIG. 11, etc.) are initialized.

A write operation is executed (S220). After the write operation, a verify operation is executed and an inhibition operation is executed according to the result of the verify operation (S230).

In particular, the write operation may be executed using a write period including first to kth loops L1 to Lk. The start pulse used in the first loop L1 may be determined based on the previous write operation. A verify operation may be executed for each of the first to kth loops L1 to Lk. As discussed above, in the first loop L1, the verify operation may be executed using two verify reference values (e.g., VR2_LS and VR2_US). According to the verify result, in the remaining loops L2 to Lk, the verify operation may be executed using one verify reference value (e.g., VR2_LS). The sense amplifier associated with the other verify reference value (e.g., VR2_US) not used in the remaining loops L2 to Lk is inhibited. The term "inhibited" used herein may mean the sense amplifier is disabled or, even if enabled, a sensing result of the sense amplifier is not used.

It is determined whether all of write drivers have passed or failed in the write operation (S240).

If any one of the write drivers has failed in the write operation, the number of loops is increased by 1 (S250). In a state in which the number of loops is increased by 1, the write operation (S220) and the verify and inhibit operation (S230) are executed again.

If all of the write drivers have passed in the write operation, a start pulse control signal (SPCTRL) to be used in the next write operation is set up (S260). For example, the start pulse may be adjusted using the number of first loops executed during the previous write operation by the incremental one-way write method and the number of second loops executed during the previous write operation by the decremental one-way write method.

Figure 10:
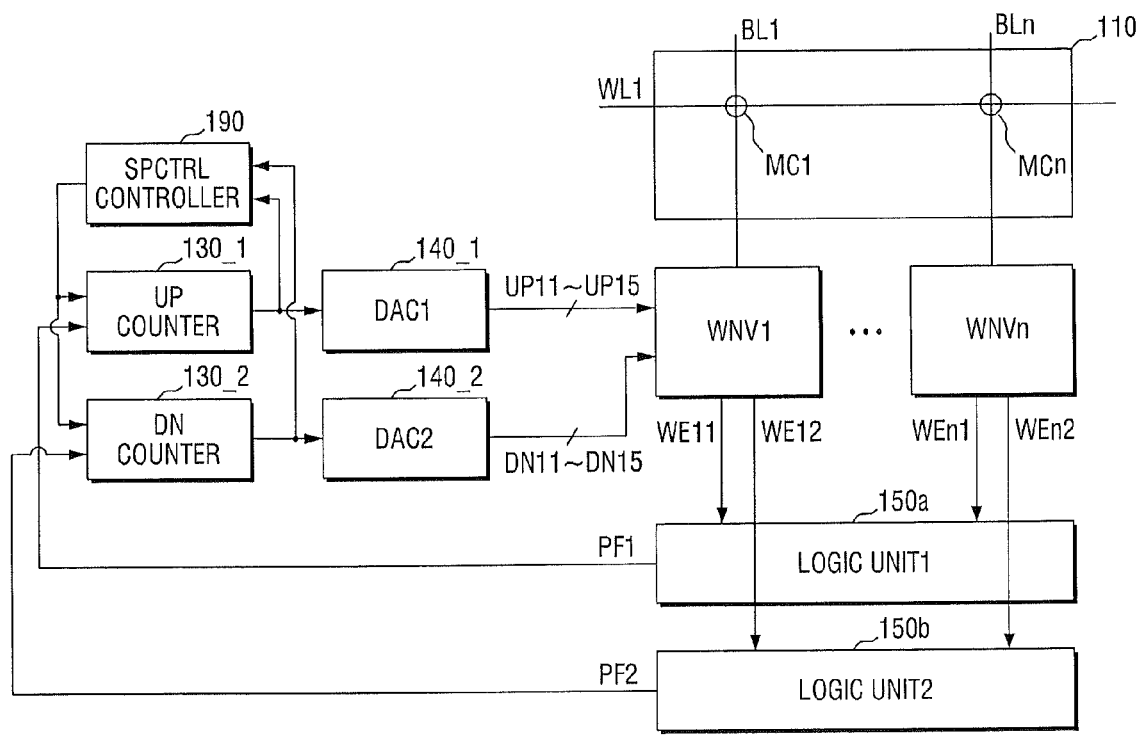
FIG. 10 is a block diagram of a nonvolatile memory device according to some embodiments of the present inventive concept.

FIG. 10 is a block diagram of a nonvolatile memory device according to some embodiments of the present inventive concept, illustrating a specific implementation example of the nonvolatile memory devices discussed above with respect to FIGS. 4 to 9.

Referring now to FIG. 10, the nonvolatile memory device according to an embodiment of the present inventive concept includes a memory cell array 110, a plurality of write/verify units WNV1 to WNVn, first logic unit 150a, a second logic unit 150b, a first counter 130_1, a second counter 130_2, a first digital-analog-converter 140_1, a second digital-analog-converter 140_2, and a controller 190.

Each of the plurality of write/verify units WNV1 to WNVn may include a write driver, a sense amplifier, and so on.

The write drivers of the write/verify units WNV1 to WNVn provide a start pulse UP11 or DN11 determined based on the previous write operation to a resistive memory cell (e.g., MC1).

Accordingly, the sense amplifier verifies whether the write operation has been executed accurately using the start pulse UP11 or DN11. Meanwhile, each sense amplifier may perform the verify operation using two verify reference values VR2_LS and VR2_US different from each other. according to the verify result, the write driver may perform a write operation on the resistive memory cell MC 1 by the incremental one-way write method (① of FIG. 7) or the decremental one-way write method (② of FIG. 7). In the incremental one-way write method, as the number of loops in a write period increases, a write current supplied to the resistive memory cell is increased. Conversely, in the decremental one-way write method, as the number of loops in a write period decreases, a write current supplied to the resistive memory cell is decreased.

An exemplary structure of the write/verify unit WNV1 will later be described with reference to FIGS. 11 to 13.

The first logic unit 150a receives a plurality of write enable signals WE11 to WEn1 and outputs a first pass/fail signal PF1. In these embodiments, the write enable signal (e.g., WE11) may be a signal for executing a verify operation using the first verify reference value VR2_LS and may correspond to the first verify signal (SAout1 of FIG. 11) indicating the verify result.

When any one of the plurality of write enable signals WE11 to WEn1 is activated, the first pass/fail signal PF1 may be activated. When all of the plurality of write enable signals WE11 to WEn1 are deactivated, the first pass/fail signal PF1 may be deactivated. If a maximum loop of the write period is reached, the first pass/fail signal PF1 may be deactivated.

Similarly, the second logic unit 150b receives a plurality of write enable signals WE12 to WEn2 and outputs a second pass/fail signal PF2. In these embodiments, the write enable signal (e.g., WE12) may be a signal for executing a verify operation using the second verify reference value VR2_US and may correspond to the second verify signal (SAout2 of FIG. 11) indicating the verify result. When any one of the plurality of write enable signals WE12 to WEn2 is activated, the second pass/fail signal PF2 may be activated. When all of the plurality of write enable signals WE12 to WEn2 are deactivated, the second pass/fail signal PF2 may be deactivated. If a maximum loop of the write period is reached, the second pass/fail signal PF2 may be deactivated.

The first counter 130_1 counts the number of first loops in response to the first pass/fail signal PF1 from the first logic unit 150a. In these embodiments, the number of first loops means the number of loop counts executed by the incremental one-way write method, which is because the first pass/fail signal PF1 corresponds to the first verify signal SAout1 obtained using the first verify reference value.

The second counter 130_2 counts the number of second loops in response to the second pass/fail signal PF2 from the second logic unit 150b. In these embodiments, the number of second loops means the number of loop counts executed by the decremental one-way write method, which is because the second pass/fail signal PF2 corresponds to the second verify signal SAout2 obtained using the second verify reference value.

The controller 190 generates the start pulse control signal SPCTRL based on the number of first loops and the number of second loops. In detail, in order to generate the most appropriate start pulse UP11 or DN11 to be used in a next write operation, the controller 190 generates the start pulse control signal SPCTRL based on the number of first loops and the number of second loops, which are counted in the previous write operation.

As discussed above, for example, if the number of first loops is greater than the number of second loops, the controller 190 controls the start pulse control signal SPCTRL to increase the start pulse UP11 or DN11 of the next write operation.

Conversely, if the number of first loops is smaller than the number of second loops, the controller 190 controls the start pulse control signal SPCTRL to decrease the start pulse UP11 or DN11 of the next write operation.

The controller 190 may control the start pulse UP11 or DN11 by controlling the start pulse control signal SPCTRL. As the result, the controller 190 may adjust to make the number of first loops equal to the number of second loops.

The first counter 130_1 and the second counter 130_2 receive the start pulse control signal SPCTRL and adjust starting points of the next write operation. In such a manner, the start pulse UP11 or DN11 may be adjusted.

Each of the digital-to-analog converters 140_1 and 140_2 decodes outputs of the counters 130_1 and 130_2 to then output write currents UP11 to UP15 and DN11 to DN15 to the plurality of write/verify units WNV1 to WNVn.

Figure 11:
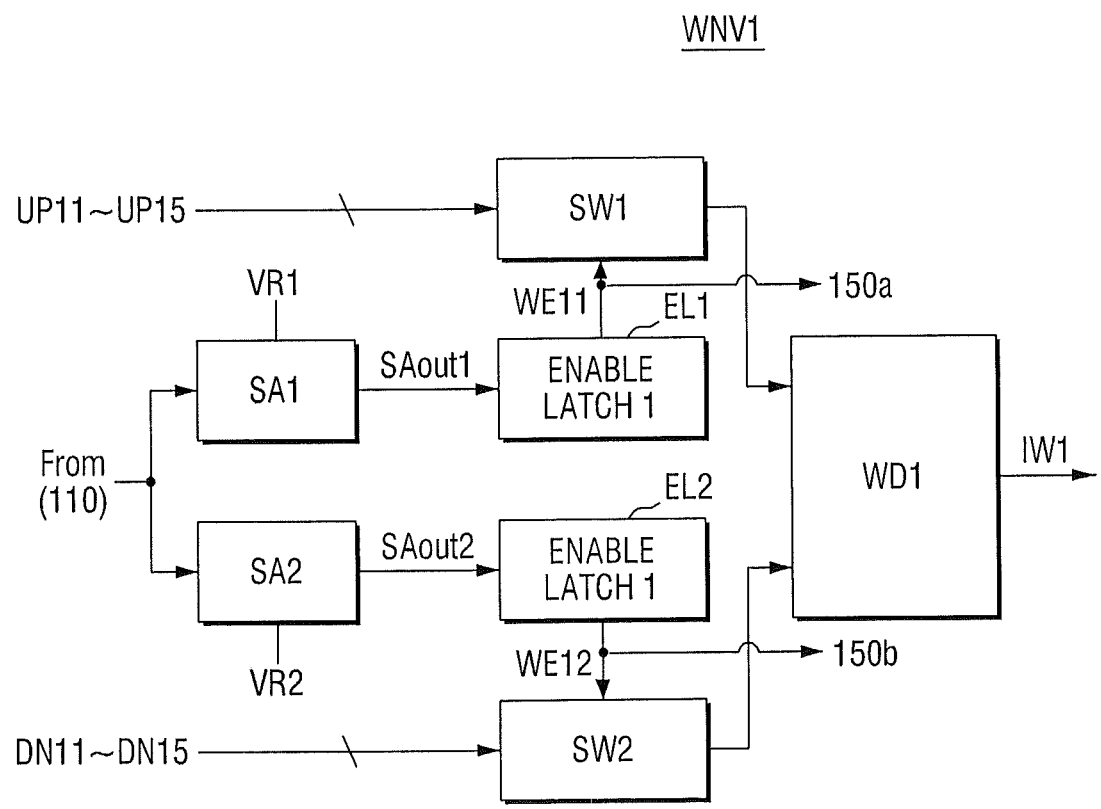
FIGS. 11 and 12 illustrate exemplary structures of write/verify units illustrated in FIG. 10.
Figure 12:
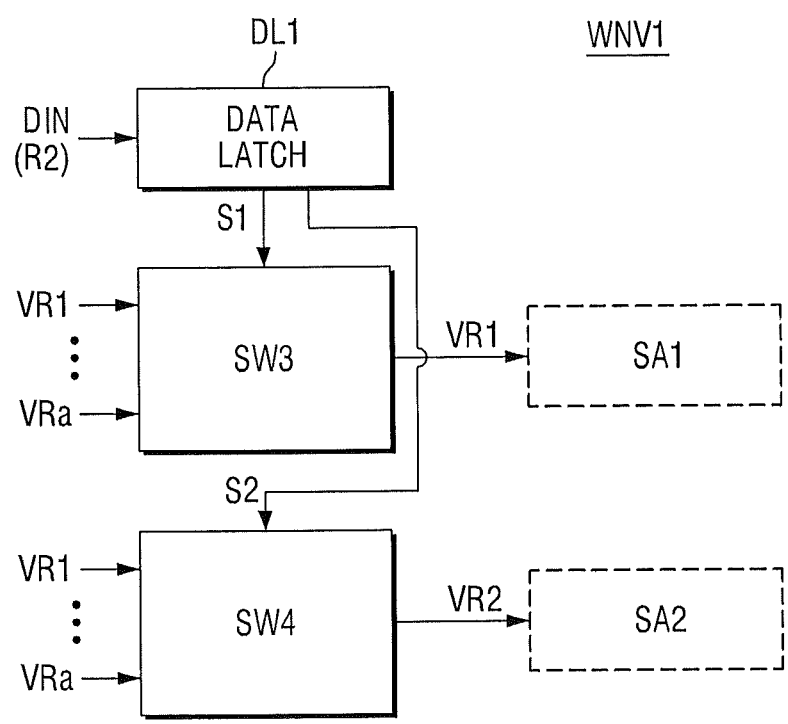

FIGS. 11 and 12 illustrate exemplary structures of write/verify units illustrated in FIG. 10.

Referring to FIGS. 11 and 12, the write/verify unit shown in FIG. 10 (e.g., WNV1) may include all of the elements shown in FIGS. 11 and 12. The other write/verify units WNV2 to WNVn may have substantially the same configurations with the write/verify unit WNV1.

The write/verify unit WNV1 may include a write driver WD1, a first sense amplifier SA1, a second sense amplifier SA2, a first enable latch EL1, a second enable latch (EL2), a data latch DL1, a first switch SW1, a second switch SW2, a third switch SW3, and a fourth switch SW4.

Data DIN to be written in the resistive memory cell is stored in the data latch DL1. The data latch DL1 provides a select signal S1, S2 or S3 corresponding to the data DIN to be written to the third switch SW3 and the fourth switch SW4. For example, second data R2 may be stored in the data latch DL1.

The third switch SW3 is electrically connected to the first sense amplifier SA1 and selects a verify reference value (one of a plurality verify reference values VR1 to VRa) to be supplied to the first sense amplifier SA1 among the plurality verify reference values VR1 to VRa (where a is a natural number greater than 2) in response to the select signal S1. For example, if the data DIN to be written is second data R2, the verify reference value VR1 may be selected. The first sense amplifier SA1 verifies whether the write operation has accurately been executed using the selected verify reference value VR1 and outputs the first verify signal SAout1 indicating the verify result.

Furthermore, the fourth switch SW4 is electrically connected to the second sense amplifier SA2 and selects a verify reference value (one of a plurality verify reference values VR1 to VRa) to be supplied to the second sense amplifier SA2 among the plurality verify reference values VR1 to VRa (where a is a natural number greater than 2) in response to the select signal S2. For example, if the data DIN to be written is second data R2, the verify reference value VR2 may be selected. The second sense amplifier SA2 verifies whether the write operation has accurately been executed using the selected verify reference value VR2 and outputs the second verify signal SAout2 indicating the verify result.

The first enable latch EL1 stores the first verify signal SAout1 and outputs the first write enable signal WE11 corresponding to the first verify signal SAout1 to the first switch SW1.

The second enable latch EL1 stores the second verify signal SAout2 and outputs the second write enable signal WE12 corresponding to the second verify signal SAout2 to the second switch SW2.

For example, it is assumed that the first verify signal SAout1 is a signal indicating a fail result, and the second verify signal SAout2 is a signal indicating a pass result.

In these embodiments, the first enable latch EL1 receives the first verify signal SAout1 and activates the first write enable signal WE11. Therefore, the first switch SW1 is enabled to then transmit the pulses UP11 to UP15 to the write driver WD1.

The second enable latch EL2 receives the second verify signal SAout2 and deactivates the write enable signal WE12. Therefore, the second switch SW2 is disabled, so that the pulses DN11 to DN15 are not transmitted to the write driver WD2.

In these embodiments, the first enable latch EL1 and the second enable latch EL2 are one-way latches, so that values stored therein are not changed until the current write period is ended after the verify signal SAout1 indicating a pass result is received.

Figure 13:
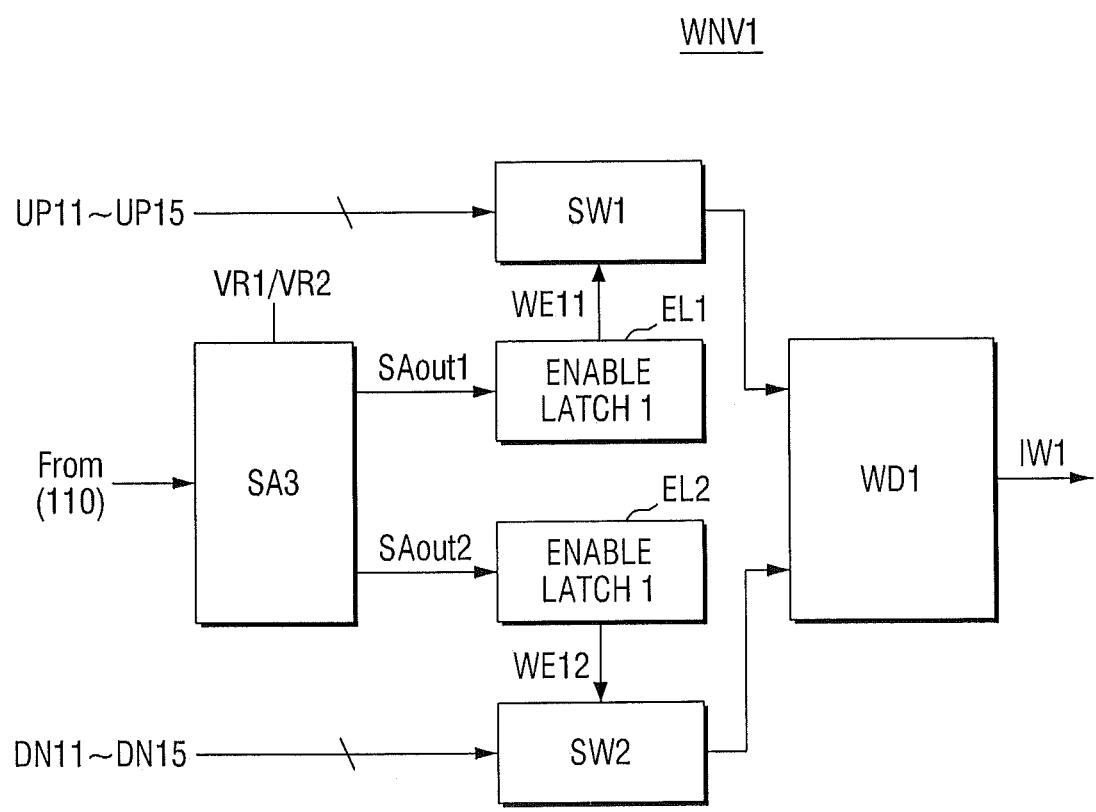
FIG. 13 is a block diagram of a nonvolatile memory device according to some embodiments of the present inventive concept.

FIG. 13 is a block diagram of a nonvolatile memory device according to another embodiment of the present inventive concept. For the sake of convenient explanation, the following description will focus on differences of the nonvolatile memory devices shown in FIGS. 11 and 13.

Referring to FIG. 13, the nonvolatile memory device according to another embodiment of the present inventive concept employs a single sense amplifier SA3.

Figure 15:
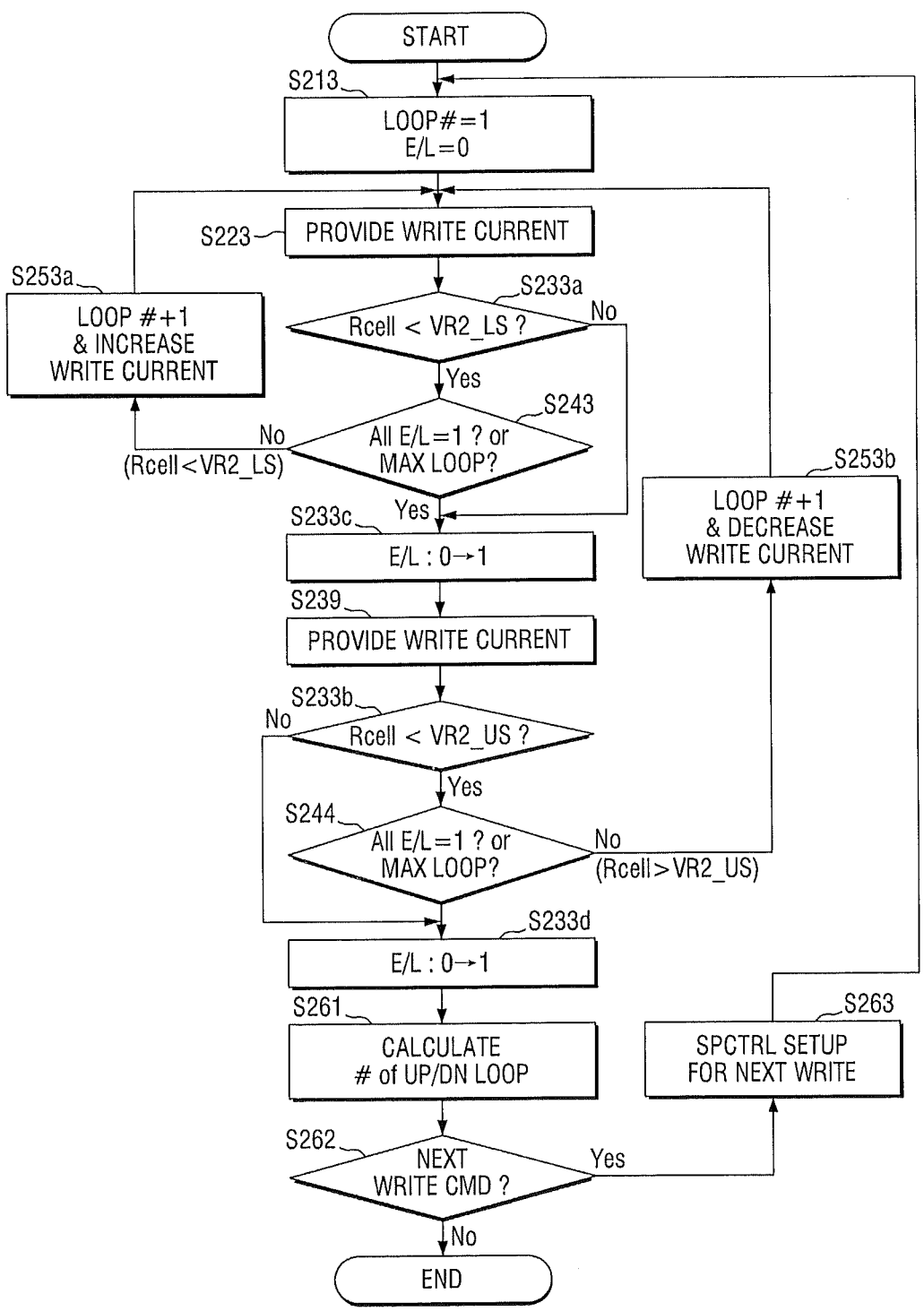
FIG. 15 is a flowchart illustrating a driving method of a nonvolatile memory device according to some embodiments of the present inventive concept.

As occasions demand, the verify reference value VR1 or the verify reference value VR2 may be selectively connected to the sense amplifier SA3. As will be described later, the verify reference value VR1 or the verify reference value VR2 may be used when verify operations are sequentially executed, as shown in FIG. 15.

Figure 14:
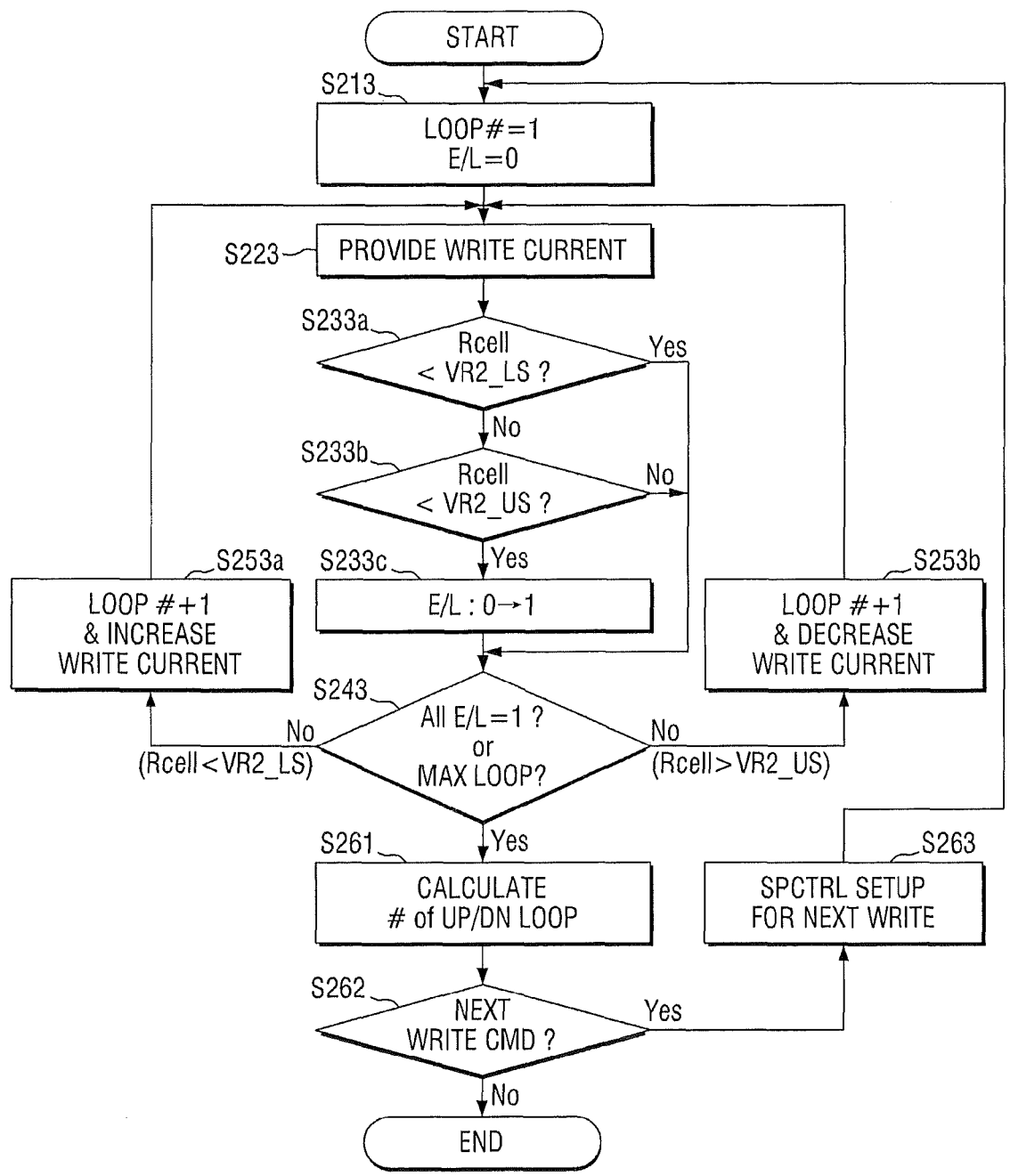
FIG. 14 is a flowchart illustrating a driving method of a nonvolatile memory device according to some embodiments of the present inventive concept.

FIG. 14 is a flowchart illustrating a driving method of a nonvolatile memory device according to another embodiment of the present inventive concept. Specifically, FIG. 14 illustrates verify operations performed in a pipelined method.

Referring to FIG. 14, the number of loops of each of multiple counters 130_1 and 130_2 is initialized to 1. An enable latch (e.g., EL1 or EL2) is set to 0 (S213).

A write current is provided to execute a write operation (S223). As discussed above, a start pulse is determined based on the previous write operation.

It is verified using two verify reference values VR2_LS and VR2_US whether data has accurately been written in the resistive memory cell. In detail, if a resistance value Rcell of the resistive memory cell is greater than the verify reference value VR2_LS (S233a) and the resistance value Rcell of the resistive memory cell is smaller than the verify reference value VR2_US (S233b), the enable latch EL1 makes a transition from 0 to 1 (S233c).

If the resistance value Rcell of the resistive memory cell is smaller than the verify reference value VR2_LS or greater than the verify reference value VR2_US, the routine proceeds to S243.

It is determined whether all of the enable latches EL1 and EL2 make transition to 1 and whether the write operation has been executed to reach a maximum loop of the write period (S243).

If all of the enable latches EL1 and EL2 make transition to 1 or if the write operation has been executed to reach a maximum loop of the write period, the current write operation is terminated to move to S261.

If all of the enable latches EL1 and EL2 do not make transition to 1 and if the write operation has not been executed to reach a maximum loop of the write period, the number of loop counts is increased one by one. If the resistance value Rcell of the resistive memory cell is smaller than the verify reference value VR2_LS, the write current is increased (S253a). However, if the resistance value Rcell of the resistive memory cell is greater than the verify reference value VR2_US, the write current is decreased (S253b).

If the current write operation is terminated, the number of first loops executed during the terminated current write operation by the incremental one-way write method, that is, the number of UP loops, and the number of second loops executed during the terminated current write operation by the decremental one-way write method, that is, the number of DN loops, are counted (S261).

It is determined whether a next write command is input or not (S262).

If yes, the start pulse control signal SPCTRL is set up for the next write operation (S263). If not, the routine is ended.

FIG. 15 is a flowchart illustrating a driving method of a nonvolatile memory device according to still another embodiment of the present inventive concept. In particular, FIG. 15 illustrates a case of sequentially executing verify operations. For the sake of convenient explanation, the following description will focus on differences of the driving methods illustrated in FIGS. 14 and 15.

Referring to FIG. 15, the number of loops of each of multiple counters 130_1 and 130_2 is initialized to 1. An enable latch (e.g., EL1 or EL2) is set to 0 (S213).

A write current is provided to execute a write operation (S223). As discussed above, a start pulse is determined based on the previous write operation.

It is verified using two verify reference value VR2_LS whether data has accurately been written in the resistive memory cell (233a). If a resistance value Rcell of the resistive memory cell is smaller than the verify reference value VR2_LS, the routine proceeds to S243. If the resistance value Rcell of the resistive memory cell is greater than the verify reference value VR2_LS, the routine proceeds to S233c.

It is determined whether all of the enable latches (e.g., EL1) make transition to 1 and whether the write operation has been executed to reach a maximum loop of the write period (S243).

If yes, the corresponding enable latch EL1 is allowed to make a transition to 1 (S233c).

The write current is again supplied to execute a write operation (S239). As described above, the start pulse is determined based on the previous write operation.

It is verified using the verify reference value VR2_US whether data has accurately been written in the resistive memory cell (S233b). If a resistance value Rcell of the resistive memory cell is smaller than the verify reference value VR2_US, the routine proceeds to S244. If the resistance value Rcell of the resistive memory cell is greater than the verify reference value VR2_US, the routine proceeds to S233d.

It is determined whether all of the enable latches (e.g., EL2) make transition to 1 and whether the write operation has been executed to reach a maximum loop of the write period (S244).

If yes, the corresponding enable latch EL2 is allowed to make a transition to 1 (S233d).

If the current write operation is terminated, the number of first loops executed during the terminated current write operation by the incremental one-way write method, that is, the number of UP loops, and the number of second loops executed during the terminated current write operation by the decremental one-way write method, that is, the number of DN loops, are counted (S261).

It is determined whether a next write command is input or not (S262).

If yes, the start pulse control signal SPCTRL is set up for the next write operation (S263). If not, the routine is ended.

FIGS. 16 to 20 illustrate memory systems using nonvolatile memory devices according to some embodiments of the present inventive concept.

Figure 16:
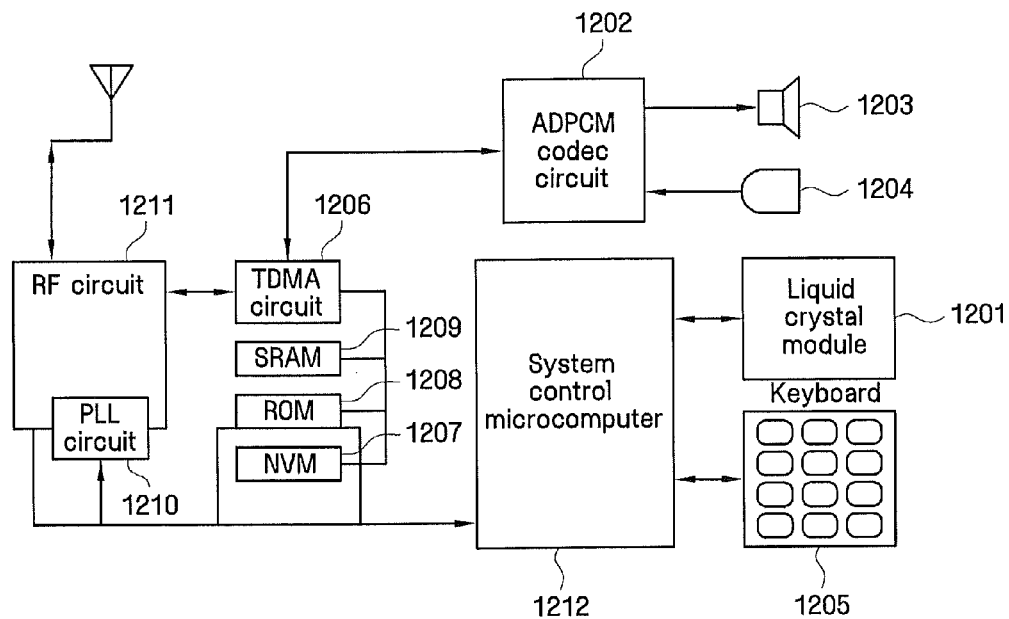
FIGS. 16 to 20 illustrate memory systems according to some embodiments of the present inventive concept.

FIG. 16 is an exemplary block diagram of a cellular phone system using a nonvolatile memory device according to some embodiments of the present inventive concept.

Referring to FIG. 16, the cellular phone system may include a ADPCM codec circuit 1202 for audio compression or decompression, a speaker 1203, a microphone 1204, a TDMA circuit 1206 for time-divisional multiplexing accessing to digital data, a PLL circuit 1210 for setting a carrier frequency of an RF signal, and an RF circuit 1211 for transmitting/receiving the RF signal.

Furthermore, the cellular phone system may include various kinds of memories including, for example, a nonvolatile memory 1207, ROM 1208, and SRAM 1209. The nonvolatile memory 1207 may be nonvolatile memory devices according to embodiments of the present inventive concept, and may include, for example, ID number. The ROM 1208 may store programs, and the SRAM 1209 may serve as the working area for a system controlling microcomputer 1212 or may temporarily store data. In these embodiments, the system controlling microcomputer 1212 may be a processor controlling write and read operations of the nonvolatile memory 1207.

Figure 17:
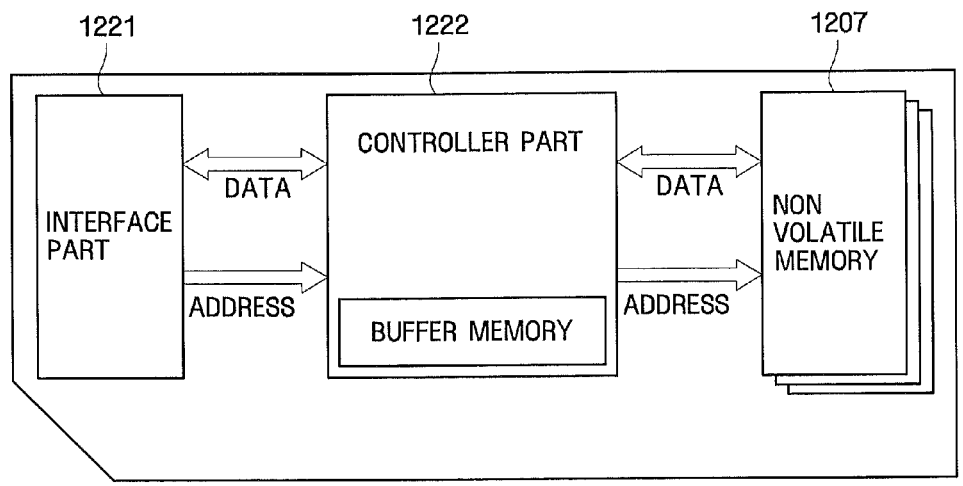

FIG. 17 is an exemplary block diagram of a memory card using a nonvolatile memory device according to some embodiments of the present inventive concept.

Referring now to FIG. 17, the memory card may include, for example, a multimedia card (MMC), a secure digital (SD) card, multiuse card, a micro SD card, a multiuse card, such as a memory stick, a compact SD card, an ID card, a personal computer memory card international association (PCMCIA) card, an SSD card, a chip card, a smart card, a USB card, and so on.

Referring now to FIG. 17, the memory card may include at least one of an interface part 1221 performing interfacing with an external device, a controller part 1222 having a buffer memory and controlling the operation of a memory card, and the nonvolatile memory 1207 according to the embodiments of the present inventive concept. The controller part 1222 may be a processor capable of controlling the write and read operations of the nonvolatile memory 1207. In detail, the controller part 1222 may be coupled to the nonvolatile memory 1207 and the interface part 1221 through a data bus DATA and an address bus ADDRESS.

Figure 18:
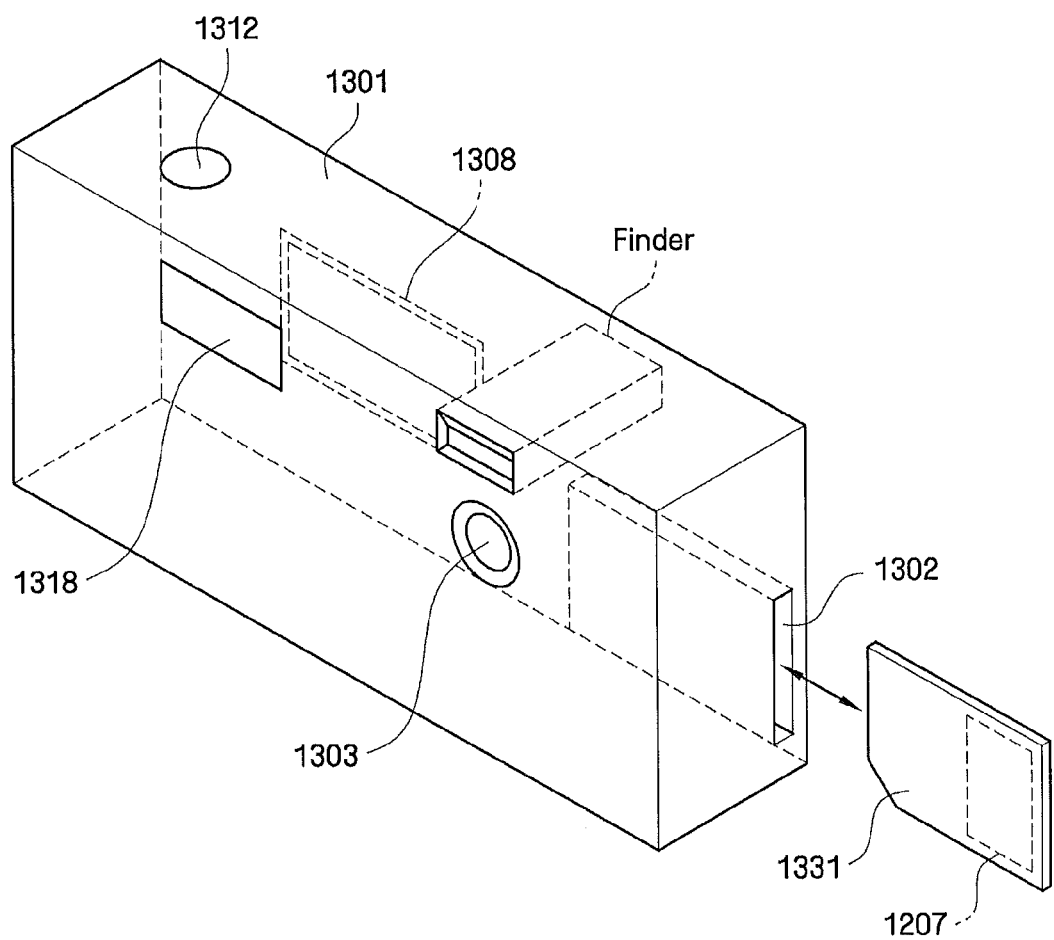

FIG. 18 is an exemplary block diagram of a digital still camera using a nonvolatile memory device according to embodiments of the present inventive concept.

Referring to FIG. 18, the digital still camera may include a body 1301, a slot 1302, a lens 1303, a display 1308, a shutter button 1312, and a strobe 1318. In particular, a memory card 1331 may be inserted into the slot 1308. The memory card 1331 may include at least one nonvolatile memory 1207 according to some embodiments of the present inventive concept.

When the memory card 1331 is of a contact type, the memory card 1331 may come into contact with a particular electric circuit provided on a circuit board when it is inserted into the slot 1308. When the memory card 1331 is of a non-contact type, the memory card 1331 may perform communication through an RF signal.

Figure 19:
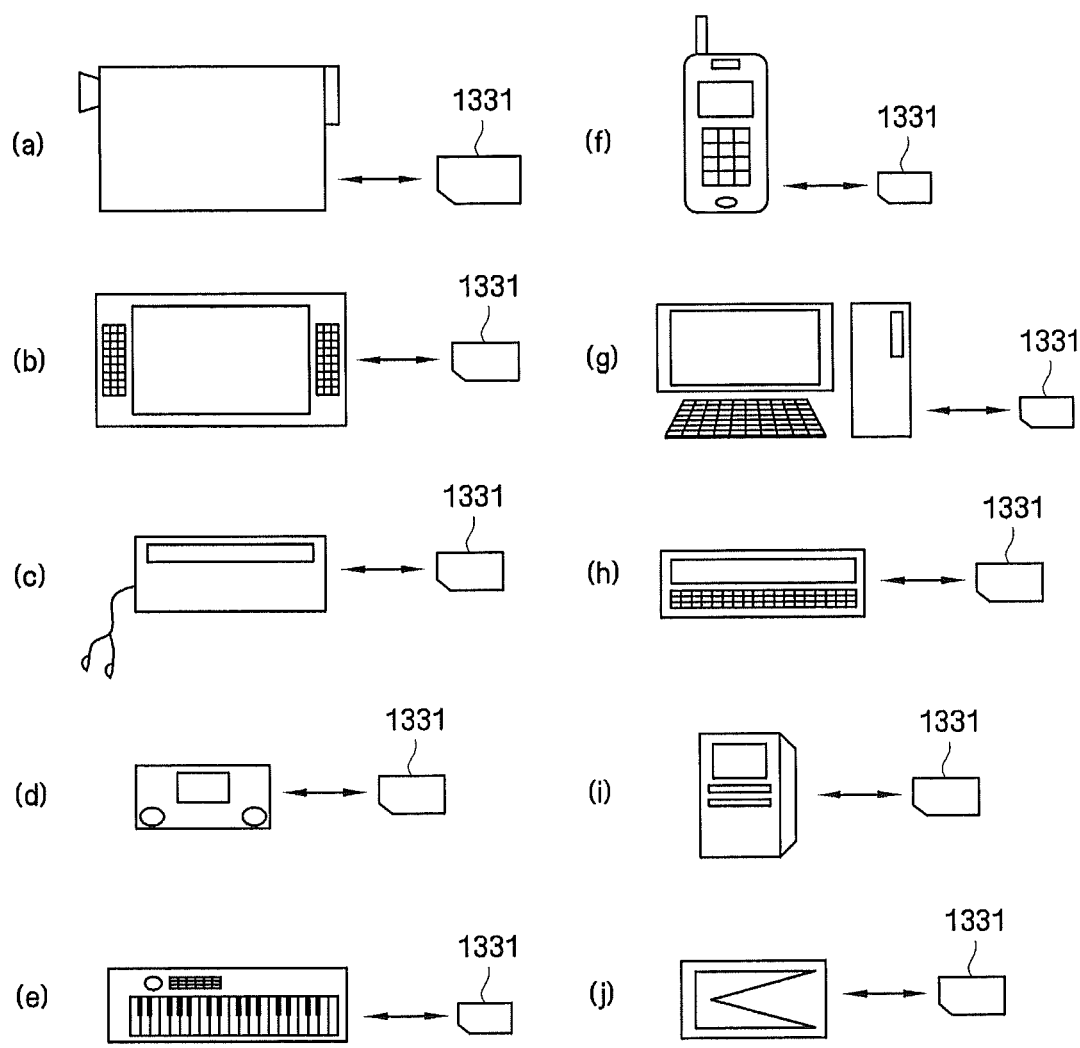

FIG. 19 illustrates various systems using the memory card shown in FIG. 17.

Referring to FIG. 19, the memory card 1331 may be used in various systems including (a) a video camera, (b) a television, (c) an audio device, (d) a game console, (e) an electronic music player device, (f) a mobile phone, (g) a computer, (h) a personal digital assistant (PDA), (i) a voice recorder, (j) a PC card, and so on.

Figure 20:
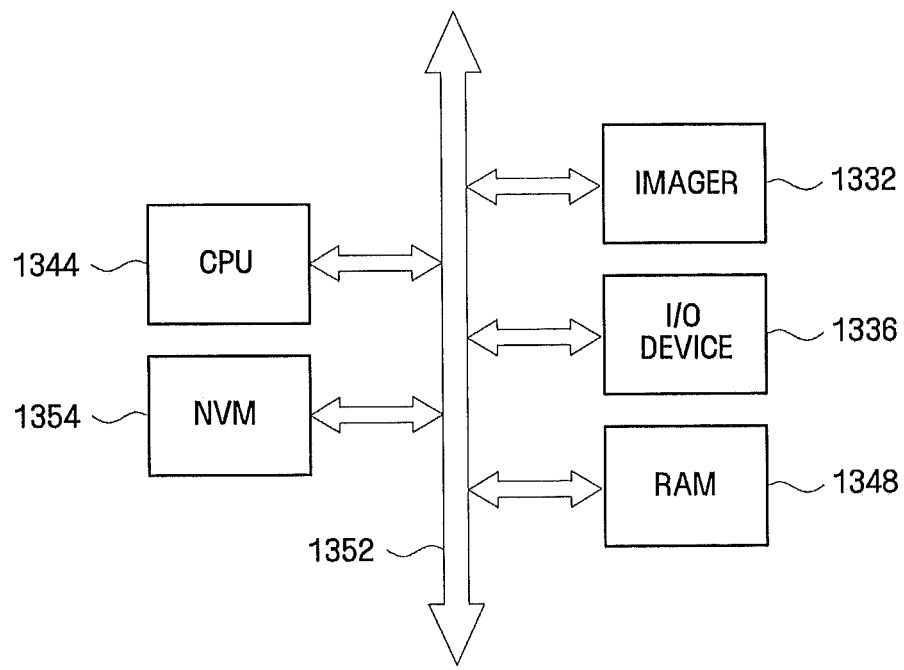

FIG. 20 is an exemplary block diagram of an image sensor system using a nonvolatile memory device according to embodiments of the present inventive concept.

Referring to FIG. 20, the image sensor system may include an image sensor 1332, an input/output (I/O) device 1336, an RAM 1348, a CPU 1344, and a nonvolatile memory 1354 according to some embodiments of the present inventive concept. The respective components, that is, the image sensor 1332, the I/O device 1336, the RAM 1348, the CPU 1344, and the nonvolatile memory 1354 may communicate with each other through a bus 1352. The image sensor 1332 may include a photo sensing element, such as a photo gate, a photo diode, and so on. The respective components may be incorporated into a single chip together with the processor, and the processor and the respective components may be configured as separate chips.

Figure 21:
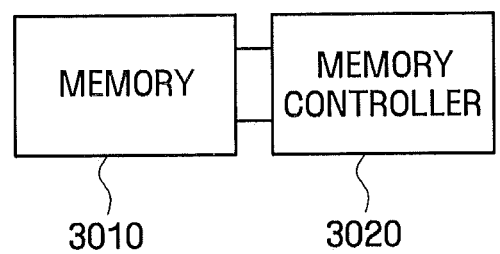
FIG. 21 is an exemplary block diagram of a memory system using a nonvolatile memory device according to some embodiments of the present inventive concept.

FIG. 21 is an exemplary block diagram of a memory system using a nonvolatile memory device according to some embodiments of the present inventive concept.

As illustrated in FIG. 21, the memory 3010 is coupled to a memory controller 3020. The memory 3010 may be any one of the memories according to the above-described embodiments. The memory controller 3020 supplies input signals for controlling the operation of the memory 3010. For example, the memory controller 3020 may transmit a command CMD and an address signal to the memory 3010. The memory controller 3020 may include a memory interface, a host interface, an ECC circuit, a central processing unit (CPU), a buffer memory, and so on. The memory interface may transmit data from the buffer memory to the memory 3010 or may read data from the memory 3010 to then transmit the read data to the buffer memory. Furthermore, the memory interface may transmit the command CMD and the address signal from an external host to the memory 30120.

The host interface may communicate with an external host through one of various interface protocols such as universal serial bus (USB), small computer small interface (SCSI) protocol, peripheral component interconnection (PCI)-express protocol, advanced technology electronics (ATA) protocol, parallel-ATA protocol, serial-ATA (SATA) protocol, serial attached SCSI (SAS), and so on.

The memory system according to embodiments of the present inventive concept may include an ECC circuit. The ECC circuit may generate parity bits using data transmitted to the memory 3010. The generated parity bits and data may be stored in a particular area of the memory 3010. The ECC circuit detects an error of data read from the memory 3010. If the detected error is a correctable error, the ECC circuit corrects the data.

The CPU controls the external host or the memory 3010 through the host interface or the memory interface. The CPU may control write, read or erase operations according to firmware for driving the memory 3010.

The buffer memory temporarily stores write data supplied from an external source or data read from the memory 3010. In addition, the buffer memory may store meta data or cache data to be stored in the memory 3010. During an abrupt power-off operation, the meta data or cache data stored in the buffer memory may be stored in the memory 3010. The data stored in the buffer memory may be a DRAM or an SRAM.

Figure 22:
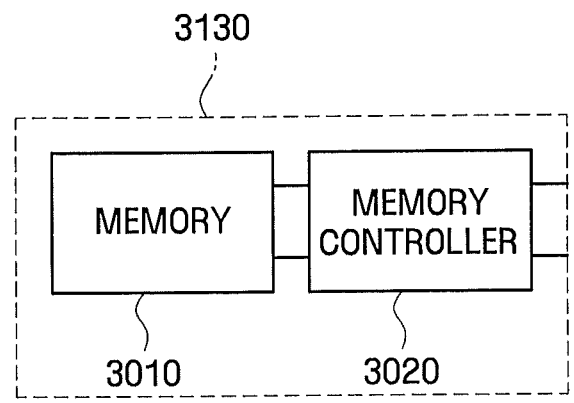
FIG. 22 is an exemplary block diagram of a memory system using a nonvolatile memory device according to some embodiments of the present inventive concept.

FIG. 22 is an exemplary block diagram of a memory system using a nonvolatile memory device according to some embodiments of the present inventive concept. The memory system according to the illustrated embodiment is substantially the same as the memory system shown in FIG. 20, except that a memory 3010 and a memory controller 3020 are embedded in a card 3130. For example, the card 3130 may be a flash memory card. That is to say, the card 3130 may be a standard product used in a consumer electronic device, such as a digital camera, a personal computer, and so on. The memory controller 3020 may control the memory 3010 according to a control signal supplied from another device (i.e., an external device).

Figure 23:
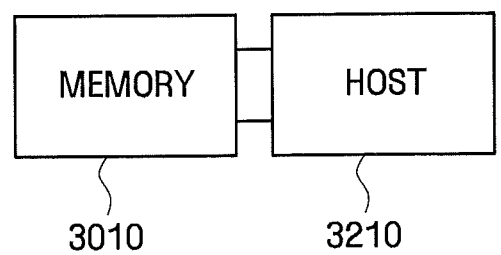
FIG. 23 is an exemplary block diagram of a memory system using a nonvolatile memory device according to some embodiments of the present inventive concept.

FIG. 23 is an exemplary block diagram of a memory system using a nonvolatile memory device according to some embodiments of the present inventive concept. As illustrated in FIG. 23, the memory 3010 may be coupled to a host 3210. The host 3210 may be a processing system, such as a personal computer, a digital camera, and so on. The host 3210 may use the memory 3010 as an erasable storage device. As discussed above, the host 3210 may supply input signals for controlling the memory 3010. For example, the host 3210 may supply a command CMD and an address signal.

Figure 24:
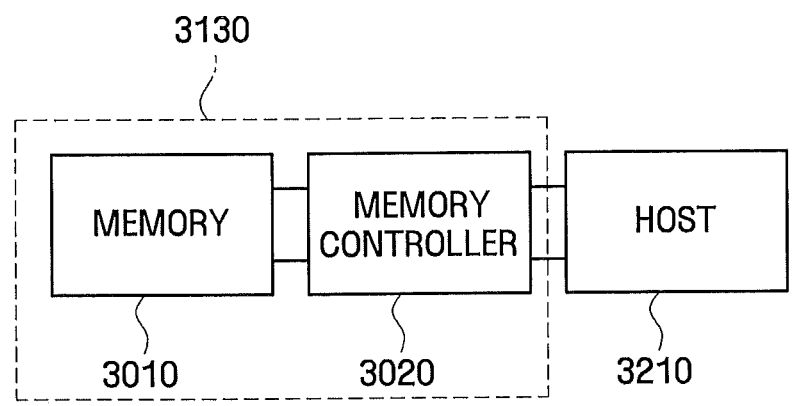
FIG. 24 is an exemplary block diagram of a memory system using a nonvolatile memory device according to some embodiments of the present inventive concept.

FIG. 24 is an exemplary block diagram of a memory system using a nonvolatile memory device according to some embodiments of the present inventive concept. A host 3210 and a card 3130 are coupled to each other. The host 3210 supplies a control signal to the card 3130 to allow the memory controller 3020 to control the memory 3010.

Figure 25:
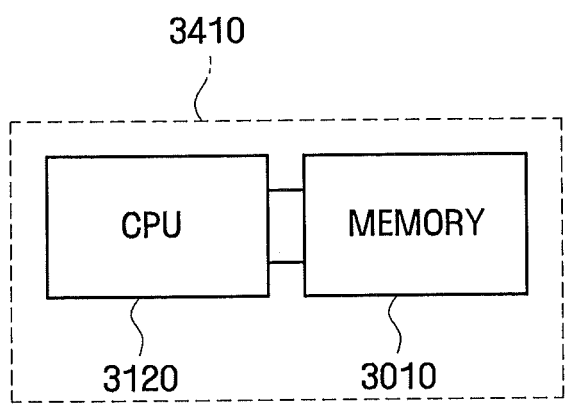
FIG. 25 is an exemplary block diagram of a memory system using a nonvolatile memory device according to some embodiments of the present inventive concept.

FIG. 25 is still another exemplary block diagram of a memory system using a nonvolatile memory device according to some embodiments of the present inventive concept. The memory 3010 may be incorporated into a CPU 3120 provided in a computer system 3410. For example, the computer system 3410 may be a personal computer, PDA, etc. The memory 3010 may be directly connected to the CPU 3120 through a bus.

The nonvolatile memory device according to embodiments of the present inventive concept may be used as a storage class memory (SCM). The SCM is a general memory having a nonvolatile characteristic and an accessing characteristic. The SCM may be used as a data storage area and a program operating area.

The above-described nonvolatile memory device using a resistance material, such as PRAM, RRAM or MRAM, may be used as the SCM. The SCM may be used as a data storage memory, in place of a flash (4230 of FIG. 27), or as a main memory, in place of SRAM (4120 of FIG. 26). An SCM may replace a flash and SRAM.

Figure 26:
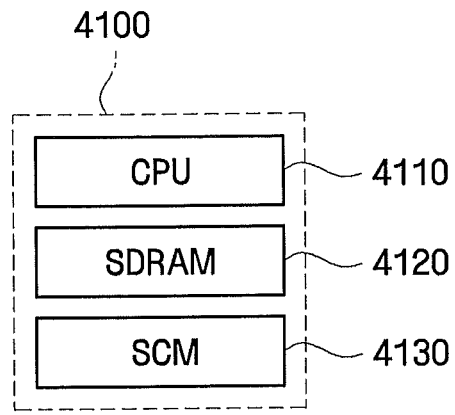
FIG. 26 is an exemplary block diagram illustrating a memory system using a storage class memory (SCM).

FIG. 26 is an exemplary block diagram illustrating a memory system using a SCM. The memory system 4100 includes a CPU 4110, an SDRAM 4120 and an SCM 4130 used in place of a flash.

In the memory system 4100, a data access speed of the SCM 4130 is higher than that of the flash. For example, when the CPU 4110 operates at 4 GHz under the PC environment, data accessing of PRAM, a kind of the SCM 4130, is approximately 32 times faster than that of the flash. Therefore, the memory system 4100 may achieve a higher-speed access gain than a memory system incorporating the flash.

Figure 27:
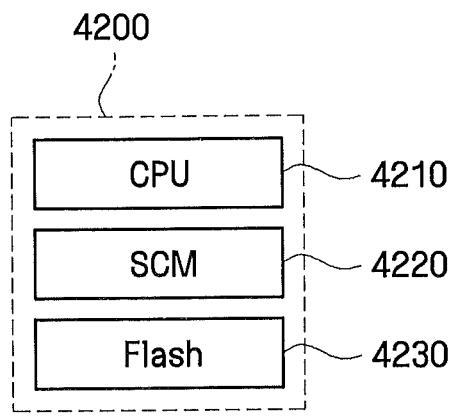
FIG. 27 is another exemplary block diagram illustrating a memory system using a storage class memory (SCM).

FIG. 27 is another exemplary block diagram illustrating a memory system using a SCM. The memory system 4200 includes a CPU 4210, an SCM 4220 used in place of SDRAM, and a flash 4230.

In the memory system 4200, the SCM 4220 uses a smaller amount of power than the SDRAM. The energy used by a main memory of the computer system is approximately 40% the energy used by the overall system. Thus, people try to reduce the energy used by the main memory. The use of the SCM may reduce dynamic energy consumption by approximately 53% and power dissipation by approximately 73%. As the result, the memory system 4200 may considerably reduce energy consumption, compared to the memory system using SDRAM.

Figure 28:
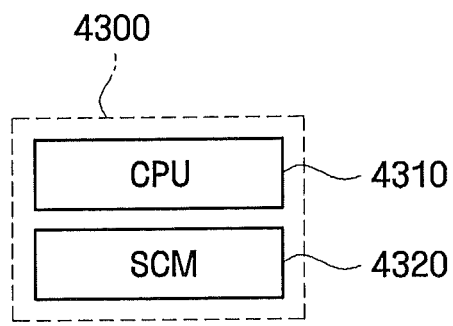
FIG. 28 is another exemplary block diagram illustrating a memory system using a storage class memory (SCM).

FIG. 28 is an exemplary block diagram illustrating a memory system using a SCM. The memory system 4300 includes a CPU 4310 and an SCM 4320 used in place of an SDRAM 4120 and a flash 4230. The SCM 4320 may be used as a main memory, instead of the SDRAM, and may used as a data storage memory, instead of the flash 4230. The memory system 4300 is advantageous in view of data access speed, low power consumption, space utilization, and cost efficiency.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A driving method of a nonvolatile memory device, the driving method comprising:
providing a start pulse adjusted based on a previous write operation to a resistive memory cell to write data;
verifying whether the data has accurately been written using the start pulse; and
executing a write operation on the resistive memory cell by an incremental one-way write method or a decremental one-way write method according to the verify result.

2. The driving method of claim 1, wherein the start pulse is adjusted using the number of first loops executed during the previous write operation by the incremental one-way write method and the number of second loops executed during the previous write operation by the decremental one-way write method.

3. The driving method of claim 2, wherein if the number of first loops is greater than the number of second loops, the start pulse is increased.

4. The driving method of claim 2, wherein if the number of first loops is smaller than the number of second loops, the start pulse is decreased.

5. The driving method of claim 2, wherein the start pulse is adjusted to make the number of first loops equal to the number of second loops in a next write operation.

6. The driving method of claim 1, wherein a first verify reference value and a second verify reference value greater than the first verify reference value are used in the verifying.

7. The driving method of claim 6, wherein if it is verified that a resistance value of the resistive memory cell is smaller than the first verify reference value, a write operation is executed on the resistive memory cell by an incremental one-way write method.

8. The driving method of claim 6, wherein if it is verified that a resistance value of the resistive memory cell is greater than the second verify reference value, a write operation is executed on the resistive memory cell by a decremental one-way write method.

9. The driving method of claim 1, wherein in the incremental one-way write method, as the number of loops in a write period is increased, a write current provided to the resistive memory cell is increased.

10. The driving method of claim 1, wherein in the decremental one-way write method, as the number of loops in a write period is increased, a write current provided to the resistive memory cell is decreased.

11. A nonvolatile memory device comprising:
a resistive memory cell;
a sense amplifier corresponding to the resistive memory cell; and
a write driver corresponding to the resistive memory cell, wherein the write driver provides a start pulse determined based on a previous write operation to the resistive memory cell, the sense amplifier performs a verify operation using the start pulse, and the write driver executes a write operation on the resistive memory cell by an incremental one-way write method or a decremental one-way write method according to the verify result.

12. The nonvolatile memory device of claim 11, further comprising:
a first counter that counts the number of first loops executed in the previous write operation by the incremental one-way write method;
a second counter that counts the number of second loops executed in the previous write operation by the decremental one-way write method; and
a controller that receives the number of first loops and the number of second loops and generates a start pulse control signal.

13. The nonvolatile memory device of claim 12, wherein if the number of first loops is greater than the number of second loops, the start pulse control signal increases the start pulse of a next write operation.

14. The nonvolatile memory device of claim 12, wherein if the number of first loops is smaller than the number of second loops, the start pulse control signal decreases the start pulse of a next write operation.

15. The nonvolatile memory device of claim 11, wherein the sense amplifier performs a verify operation using a first verify reference value and a second verify reference value greater than the first verify reference value and provides a first verify signal indicating the verify result based on the first verify reference value and a second verify signal indicating the verify result based on the second verify reference value.

16. The nonvolatile memory device of claim 15, further comprising:
a first enable latch that stores the first verify signal and provides a first write enable signal corresponding to the first verify signal; and
a second write enable signal that stores the second verify signal and provides a second write enable signal corresponding to the second verify signal.

17. The nonvolatile memory device of claim 16, wherein the first enable latch and the second enable latch are one-way latches, so that values stored therein are not changed until the current write period is ended after the verify signal indicating a pass result is received.

* * * * *